(12) United States Patent
Baillin

(10) Patent No.: US 9,041,174 B2
(45) Date of Patent: May 26, 2015

(54) GETTER HAVING TWO ACTIVATION TEMPERATURES AND STRUCTURE COMPRISING THIS GETTER

(75) Inventor: Xavier Baillin, Crolles (FR)

(73) Assignee: COMMISSARIAT A L'ENERGIES ATOMIQUE ET AUX ENERGIES ALTERNATIVES, Paris (FR)

( * ) Notice: Subject to any disclaimer, the term of this patent is extended or adjusted under 35 U.S.C. 154(b) by 1116 days.

(21) Appl. No.: 12/917,965

(22) Filed: Nov. 2, 2010

(65) Prior Publication Data

US 2011/0115056 A1 May 19, 2011

Related U.S. Application Data

(60) Provisional application No. 61/326,867, filed on Apr. 22, 2010.

(30) Foreign Application Priority Data

Nov. 17, 2009 (FR) .................................. 09 05520

(51) Int. Cl.
*H01L 23/26* (2006.01)
*B81B 7/00* (2006.01)

(52) U.S. Cl.
CPC .............. *B81B 7/0038* (2013.01); *H01L 23/26* (2013.01); *H01L 2924/0002* (2013.01)

(58) Field of Classification Search
USPC ..................................... 257/682, 729; 438/115
IPC .............................. H01L 23/26; B81B 7/0038
See application file for complete search history.

(56) References Cited

U.S. PATENT DOCUMENTS

| | | | |
|---|---|---|---|
| 7,042,075 B2 * | 5/2006 | Liebeskind | ................... 257/682 |
| 2002/0149096 A1 | 10/2002 | Liebeskind | |
| 2006/0284556 A1 | 12/2006 | Tremel et al. | |
| 2007/0080637 A1 | 4/2007 | Kasahara et al. | |
| 2008/0213539 A1 | 9/2008 | Souriau et al. | |
| 2008/0226902 A1 | 9/2008 | Giannantonio et al. | |

FOREIGN PATENT DOCUMENTS

| | | |
|---|---|---|
| EP | 1 640 333 A1 | 3/2006 |
| EP | 1 763 060 A1 | 3/2007 |
| FR | 2 883 099 A1 | 9/2006 |
| FR | 2 922 202 A1 | 4/2009 |
| JP | 2002-352700 A | 12/2002 |
| JP | 2008-532756 A | 8/2008 |
| WO | 2005/124813 A1 | 12/2005 |
| WO | 2006/097652 A1 | 9/2006 |
| WO | WO 2008/071906 A1 | 6/2008 |
| WO | WO 2009087284 A1 * | 7/2009 |

OTHER PUBLICATIONS

Dec. 16, 2014 Office Action issued in Japanese Application No. 2010-255774.

* cited by examiner

*Primary Examiner* — Marcos D Pizarro Crespo
(74) *Attorney, Agent, or Firm* — Oliff PLC

(57) ABSTRACT

The structure comprises a closed cavity under a controlled atmosphere in which a monoblock getter with a first getter layer is arranged. The first getter layer presents at least first and second getter areas which have different activation temperatures. The second getter area is formed on an adjustment sub-layer of the getter material activation temperature.

20 Claims, 6 Drawing Sheets

GETTER HAVING TWO ACTIVATION TEMPERATURES AND STRUCTURE COMPRISING THIS GETTER

BACKGROUND OF THE INVENTION

The invention relates to a monoblock getter comprising a first getter layer and a structure comprising one such monoblock getter.

STATE OF THE ART

Integration in a vacuum enables numerous devices, for example microelectronics devices such as Micro Electro Mechanical Systems (MEMS), to improve their performances. However, the use of packaging in a vacuum or in a controlled atmosphere gives rise to a number of problems, and in particular the ability to preserve the vacuum level over time and the quality of the encapsulated atmosphere.

In this direction, Non Evaporable Getter (N.E.G.) materials deposited in thin layers have been the subject of a large number of publications. These materials react and capture gases by surface adsorption and/or absorption in the volume. In this way, desorption of the materials delineating an air gap is compensated by the getter material layer which adsorbs and/or absorbs the desorbed elements of the other materials.

Integration of two different getters in a closed cavity within a packaging structure has already been described in the literature to be able to conserve an acceptable vacuum with time.

However, producing different two getters implies a complexification of the production method, in particular multiplication of the photolithography and etching steps, a non-negligible increase of the surface occupied by the getters and an increase of the price of the final structure.

OBJECT OF THE INVENTION

The object of the invention is to produce a getter which is easy to implement, which is very compact and which enables the pressure in the closed cavity of a structure to be controlled.

The getter according to the invention is characterized in that the first getter layer presents at least first and second getter areas having different crystalline structures, the first and second getter areas having different activation temperatures.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

The structure comprises a closed cavity under a controlled atmosphere inside which at least one monoblock getter is located. The cavity advantageously comprises an active element, for example an integrated circuit, a micro electro mechanical system, a light radiation detector and/or emitter. The closed cavity is airtight and a pressure lower than atmospheric pressure prevails therein, the cavity advantageously being in a vacuum. The low pressure in the cavity enables the performances or the lifetime of the active devices arranged in the cavity, typically micro electro mechanical systems, to be improved. The cavity can also be under a controlled pressure of nitrogen or argon.

Figure 1:
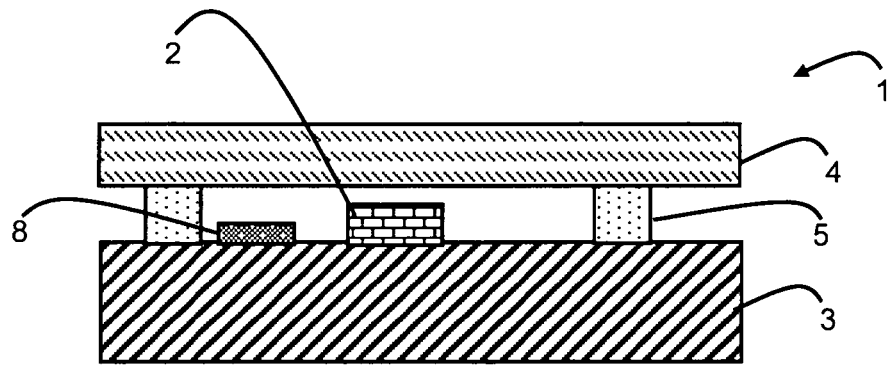
FIGS. 1 and 2 schematically represent different embodiments of a structure according to the invention, in cross-section, FIGS. 3 and 4 schematically represent a first embodiment of a monoblock getter according to the invention, in cross-section and in top view, FIG. 5 schematically represents a first alternative embodiment of a monoblock getter according to the invention, in cross-section, FIGS. 6 and 7 schematically represent a second alternative embodiment of a monoblock getter according to the invention, in cross-section and in top view, FIG. 8 schematically represents a third alternative embodiment of a monoblock getter according to the invention, in top view, FIGS. 9 and 10 schematically represent a fourth alternative embodiment of a monoblock getter according to the invention, in cross-section and in top view, FIG. 11 schematically represents a fifth alternative embodiment of a monoblock getter according to the invention, in top view, FIG. 12 schematically represents a sixth alternative embodiment of a monoblock getter according to the invention, in top view, FIG. 13 schematically represents a seventh alternative embodiment of a monoblock getter according to the invention, in cross-section, FIGS. 14 and 15 schematically represent different alternative embodiments of a monoblock getter according to the invention, in cross-section, FIG. 16 schematically represents another alternative embodiment of a monoblock getter according to the invention, in cross-section.
Figure 2:
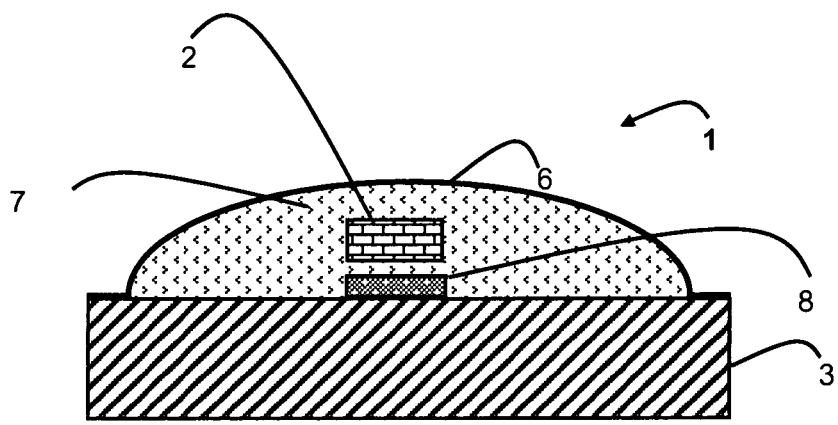

The closed cavity can be formed in different manners, and two different embodiments are illustrated in FIGS. 1 and 2 for example purposes. As illustrated in FIG. 1, structure 1 comprises at least one device 2, for example a microelectronic device, arranged in the tight cavity delineated by two substrates 3 and 4 and by a closed peripheral seal 5. Tightness of the cavity is ensured by seal 5 situated between substrates 3, 4 and which surrounds device 2. Seal 5 is for example achieved by melting an eutectic alloy, by molecular sealing or by anodic sealing. Microelectronic device 2 is for example formed on first substrate 3.

Conventionally, the height of the cavity is defined by the height of seal 5 which surrounds device 2 (FIG. 1). However, second substrate 4 can be patterned so as to form a cover comprising a thinner central part so as to increase the volume of the cavity.

Second substrate 4 is for example made from silicon, oxidized or nitrided silicon or glass. First substrate 3 is for example made from silicon or any other semi-conductor material, except for gallium arsenide (GaAs), or from another material on which an already formed device can be integrated.

In another embodiment illustrated in FIG. 2, structure 1 comprises a closed and sealed cavity which is delineated by substrate 3 and by a packaging layer 6. The tightness of the structure is then ensured by adhesion between packaging layer 6 and substrate 3. The packaging layer acts as closing cover like substrate 4 of FIG. 1. The closing cover can comprise other layers in addition to the packaging layer. In the embodiment illustrated in FIG. 2, the height of the cavity is defined by the thickness of a sacrificial material 7 deposited on the substrate.

The atmosphere in the cavity having an effect on the performance and/or on the lifetime of the devices situated in the cavity, it is necessary to control this atmosphere in its constituents and in its pressure. It is even advantageous to control this atmosphere in time, i.e. preferably throughout the theoretical lifetime of the structure.

Figure 3:
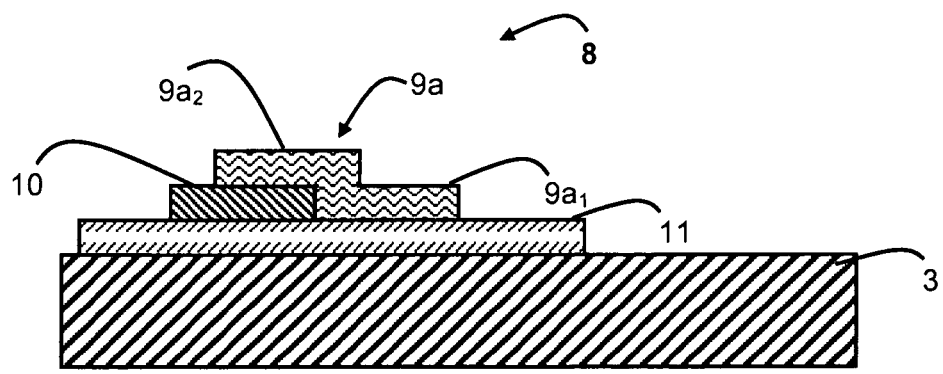
Figure 4:
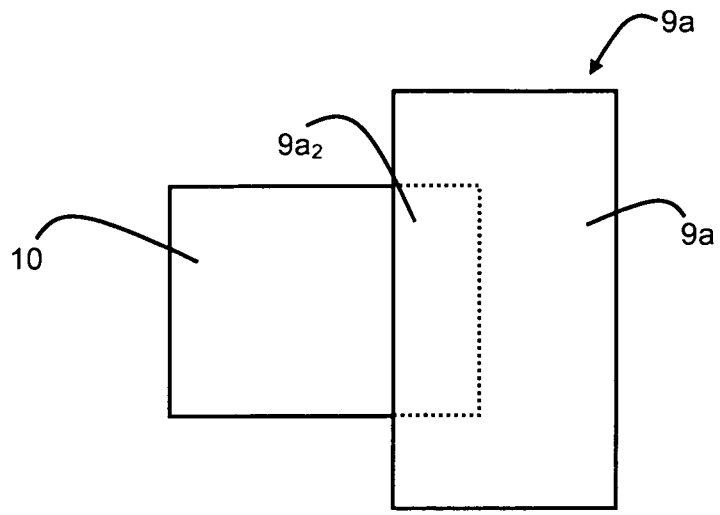

As illustrated in FIGS. 3 and 4, to achieve this objective, structure 1 comprises at least one monoblock getter 8 which presents at least two different activation temperatures, the getter being arranged in the cavity. Monoblock getter 8 comprises a first getter layer 9a which is formed by a first getter effect material. First getter layer 9a presents at least first $9a_1$ and second $9a_2$ getter areas having different activation temperatures. Second getter area $9a_2$ presents a different activation temperature from first area $9a_1$ as it presents a different crystalline structure from that of first getter area $9a_1$.

First $9a_1$ and second $9a_2$ getter areas are formed simultaneously. Second getter area $9a_2$ is formed on an adjustment sub-layer 10 of the getter material activation temperature which has the effect of modifying the crystalline structure when growth takes place. When first getter layer 9a is deposited on two different materials, first getter layer 9a does in fact simultaneously present two different crystalline structures $9a_1$, $9a_2$ although it only forms a single film. First getter layer 9a is formed partly on adjustment sub-layer 10 and partly outside adjustment sub-layer 10, for example on the substrate or on the film which covers the substrate, such as adhesion sub-layer 11 (as shown in FIG. 3).

The crystalline structure depends on the operating conditions of the getter material deposition process. The crystalline structure also depends on the crystalline structure of the layer on which the material is deposited. The monoblock getter therefore comprises a continuous film which reacts at two distinct activation temperatures, each activation temperature being proper to a particular crystalline structure present in the continuous film of the first getter effect material. The getter layer reacts with the atmosphere present so as to capture atoms or molecules such as $O_2$, $N_2$, $H_2O$, $CO$, $CO_2$ and $H_2$ by absorption or adsorption.

The activation temperatures of first getter layer 9a can therefore be defined by choosing the getter effect material which composes the layer, its deposition operating conditions and the crystalline structure of the adjustment sub-layer on which it is partially formed.

Adjustment sub-layer 10, situated underneath and in contact with first getter layer 9a, is designed to enable modulation of the activation temperature of first getter layer 9a, i.e. to adjust the temperature at which first getter layer 9a reacts with the atmosphere present inside the cavity. The adjustment sub-layer has the effect of modulating the crystalline structure of the getter layer according to the deposition operating conditions.

Adjustment sub-layer 10 is preferably made from Cu, Ni, Pt, Ag, Ru, Cr, Au, Al and presents a thickness preferably comprised between 50 and 500 nm when the thickness of first getter layer 9a is about a few hundred nanometers, typically between 100 and 2000 nm. The thickness of adjustment sub-layer 10 can be reduced to a few tens of nanometers, typically between 10 and 100 nm, when first getter layer 9a is a few hundred nanometers, typically between 100 and 1000 nm.

For example purposes, an adjustment sub-layer 10 of 30 nm is sufficient for a first getter layer 9a of 300 nm. The minimum thickness of adjustment sub-layer 10 is approximately between 5% and 10% of the thickness of first getter layer 9a, for example equal to 8%.

More generally, adjustment sub-layer 10 is for example made from a metallic material, except for palladium, deposited in the state of a pure substance which, like platinum for example, is chemically neutral with respect to first getter layer 9a in the activation field sought for. Adjustment sub-layer 10 can also be made from a getter material such as titanium or zirconium for example. When adjustment sub-layer 10 has a getter effect, the stack formed by the adjustment sub-layer and by first getter layer 9a enables a greater quantity of gases to be absorbed as the getter material volume is greater.

When deposition of first getter layer 9a is performed, second getter area $9a_2$ is formed with a different crystalline structure from that of first getter area $9a_1$, which results in a difference in the activation temperatures. The crystalline structure of second getter area $9a_2$ is in fact modified by the influence of the crystalline structure of adjustment sub-layer 10. First getter area $9a_1$ not being formed on adjustment sub-layer 10, its crystalline structure depends on its deposition temperature and on the substrate on which it grows. In this way, monoblock getter 8 presents two distinct areas having two activation temperatures as first getter layer 9a presents two areas $9a_1$ and $9a_2$ having different crystalline structures (FIG. 4).

Monoblock getter 8 thus comprises at least one continuous getter layer which reacts at two different activation temperatures. It is therefore more compact than two distinct getters as safety margins linked to the different photolithography steps do not have to be taken into account. Thus, in the structure, the whole surface dedicated to the getter part is used for pumping the atmosphere, whereas in the prior art a part is lost because of the safety margins.

The production method being simpler to implement, it is more economical, quicker, and reduces the risks of physico-chemical incompatibility between the different materials used and pollution of already formed devices by limiting the technological steps.

Figure 5:
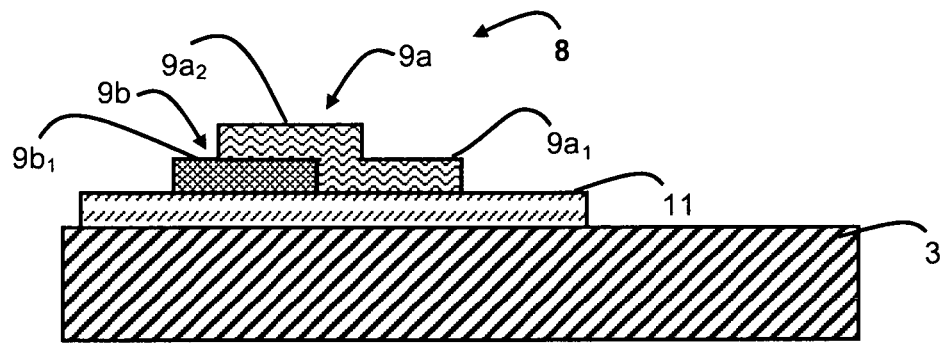

In a first alternative embodiment illustrated in FIG. 5, monoblock getter 8 comprises a first getter layer 9a and a second getter layer 9b. First getter layer 9a is formed on second getter layer 9b and also next to second getter layer 9b. Second getter layer 9b can be made from a second getter effect material which is different from the material of first getter layer 9a. It is also possible for first 9a and second 9b getter layers to be made from the same getter effect material, in which case the getter material was deposited under different operating conditions for the crystalline structure to be different between the two getter layers 9a and 9b. Second getter layer 9b then acts as an adjustment sub-layer and in addition presents the getter function. The non-covered part of second getter layer 9b, i.e. the free part, reacts as a getter area whereas the covered part does not participate in adsorption of the gas molecules but acts as a reservoir. The third getter area is thus formed by a part of the second getter layer.

In a particular embodiment, it is possible to form a reservoir made from getter material which does not present any free surface. This reservoir can be activated so as to totally or partially regenerate the pumping capacity of the getter layer which covers the reservoir. The getter material forming the reservoir presents its own activation temperature. When the reservoir is activated, the absorbed molecules and/or atoms are displaced from the getter layer to the reservoir.

Monoblock getter 8 comprises first, second and third getter areas having different activation temperatures. Two getter areas $9a_1$, $9a_2$ are formed by the same material presenting two areas with different crystalline structures, the last getter area $9b_1$ being formed by a different material. The monoblock getter can be represented in top view in equivalent manner to the getter illustrated in FIG. 4.

Figure 6:
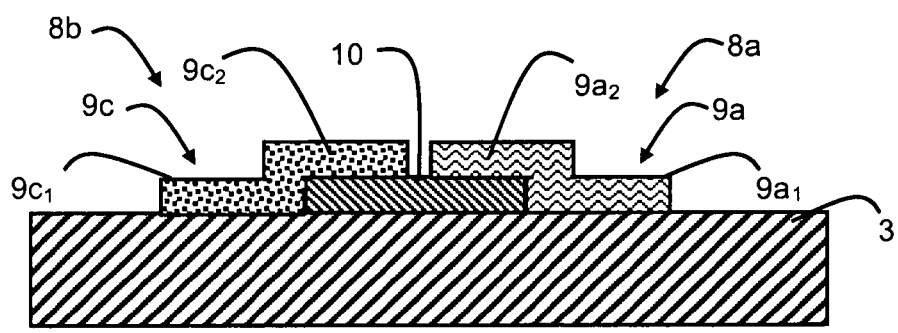
Figure 7:
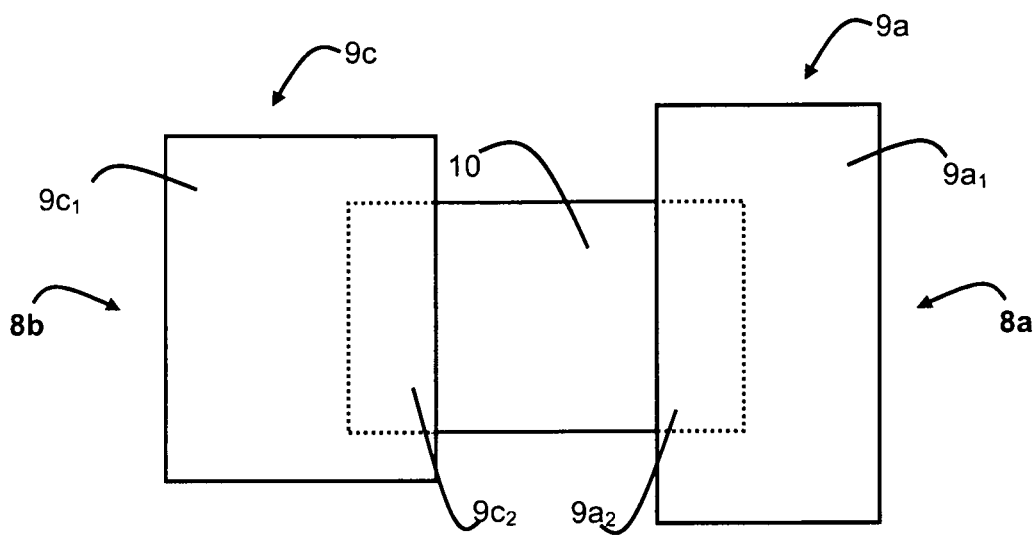

In a second alternative embodiment illustrated in FIGS. 6 and 7 which can be combined with the previous alternative embodiment, monoblock getter 8 comprises a first getter layer 9a, an adjustment sub-layer 10 and a third getter layer 9c. In order to obtain an extremely compact structure, first getter layer 9a and third getter layer 9c are formed on activation temperature adjustment sub-layer 10 and in contact direct with the latter. First getter layer 9a and third getter layer 9c both comprise a portion which is deposited outside adjustment sub-layer 10, for example on the substrate. First getter layer 9a and third getter layer 9c both present two getter areas $9a_1$, $9a_2$, $9c_1$ and $9c_2$ having different crystalline structures.

The monoblock getter then presents four getter areas. Each of the getter areas reacts to an activation temperature that is proper thereto. Each getter area is defined by a specific getter material and by a specific crystalline structure. In this monoblock getter, two getter areas are formed by the same material having two distinct crystalline structures, for example first getter layer 9a and areas $9a_1$ and $9a_2$. Two other getter areas are formed by another material also having two distinct crystalline structures, for example third getter layer 9c and areas $9c_1$ and $9c_2$.

A monoblock getter which can react to four different activation temperatures can thereby be easily obtained. By choosing the materials used, the pressure in the cavity and/or the gas composition in the cavity can be modulated finely by heating the structure and therefore the getter to a predefined temperature.

Monoblock getter 8 obtained is particularly advantageous as the lithographic constraints are minimal which enables an efficient and compact getter to be obtained at lower cost. In this embodiment, the monoblock getter comprises two sub-getters 8a and 8b which are formed on adjustment sub-layer 10 at a distance from one another. The lithographic constraint is then identical to that of two distinct and adjacent getters but these two sub-getters 8a, 8b together enable the pressure to be adjusted by means of four different activation temperatures. The monoblock getter then enables a finer adjustment of the pressure in the cavity due to a greater choice in the accessible temperatures while at the same time remaining compact. It can also be envisaged to have two getter layers identical in composition but which present crystallographic differences as they were deposited at different temperatures. The use of the same getter material deposited at different temperatures in particular reduces the risks of physico-chemical incompatibility.

Figure 8:
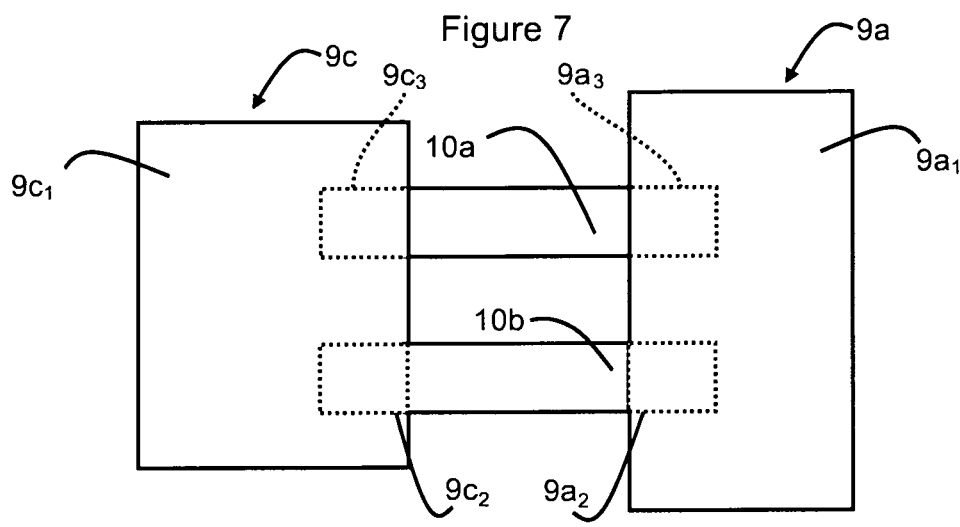

In a third alternative embodiment illustrated in FIG. 8, which can be combined with the previous embodiments, monoblock getter 8 comprises a plurality of distinct sub-layers, i.e. at least two distinct adjustment sub-layers, here two sub-layers 10a and 10b. The two adjustment sub-layers can be in joined contact or be superposed or be separate. Getter 8 can also comprise one or more getter layers. Each getter layer can partially cover all the adjustment sub-layers or only certain of the different sub-layers. In this way, at least one getter layer comprises at least two getter areas which react at two different activation temperatures. Preferably all the getter layers present two distinct getter areas which react at different temperatures. Monoblock getter 8 then comprises a plurality of activation temperatures. Each activation temperature is associated with a specific getter area which is defined by its constituent getter material and the crystalline structure.

In the particular example of FIG. 8, two distinct adjustment sub-layers 10a or 10b are both covered by two different getter layers 9a and 9c. The monoblock getter is thus composed of six getter areas ($9a_1$, $9a_2$, $9a_3$, $9c_1$, $9c_2$, $9c_3$) having different activation temperatures. First getter layer 9a and third getter layer 9c both present three different types of crystalline structures. One of the crystalline structures is linked to deposition on first adjustment sub-layer 10a, another crystalline structure is linked to deposition on second adjustment sub-layer 10b and the last structure is linked to deposition on the substrate or another material.

Figure 9:
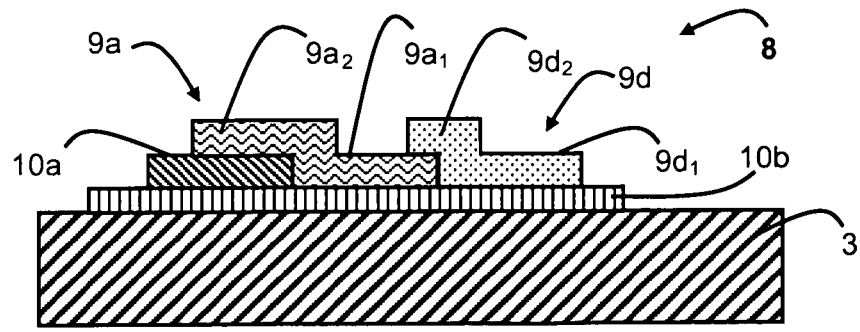
Figure 10:
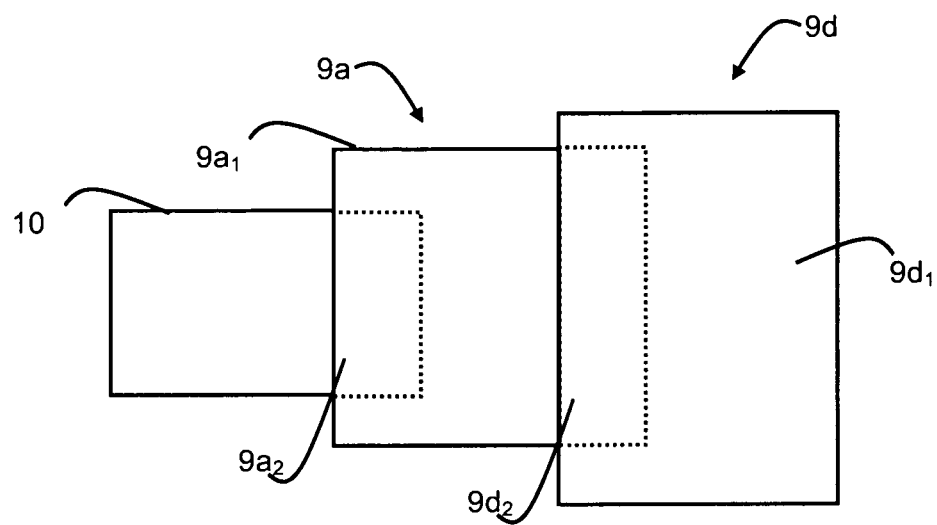

In a fourth alternative embodiment illustrated in FIGS. 9 and 10, which can be combined with the previous embodiments, monoblock getter 8 comprises a fourth getter layer 9d which presents at least first $9d_1$ and second $9d_2$ getter areas having different activation temperatures. Fourth getter layer 9d is formed partially on first getter layer 9a and partially outside first getter layer 9a, for example on the substrate or second adjustment sub-layer 10b (as shown). First getter layer 9a is formed partially on first adjustment sub-layer 10a and partially outside first adjustment sub-layer 10a, for example on the substrate or second adjustment sub-layer 10b (as shown). First getter layer 9a also presents first $9a_1$ and second $9a_2$ free getter areas having different activation temperatures. Monoblock getter 8 then comprises four getter areas which each present a specific activation temperature.

As in the previous embodiments, first $9a_1$, $9d_1$ and second $9a_2$, $9d_2$ getter areas have different crystalline structures. Second getter area $9d_2$ of the fourth getter layer 9d is formed on first getter layer 9a. First getter layer 9a acts as adjustment sub-layer for a part of fourth getter layer 9d.

Fourth getter layer 9d is advantageously formed in a different material from first getter layer 9a or from the other existing getter layers. However, it is conceivable to take the same material for fourth getter layer 9d and another existing getter layer, for example first getter layer 9a. The first areas of first $9a_1$ and fourth $9d_1$ getter layers then have the same activation temperature if the depositions of layers 9a and 9d are performed under the same operating conditions. On the contrary, if the operating conditions are different, the first areas of first $9a_1$ and fourth $9d_1$ getter layers have different activation temperatures.

Second getter area $9d_2$ of fourth getter layer 9d delineates a third area of first getter layer 9a. This third area of first getter layer 9a which is covered by fourth getter layer 9d does not participate in adsorption of first getter layer 9a, but it can act as reservoir.

Third getter layer 9c and fourth getter layer 9d form an additional getter layer which is arranged partly on an additional adjustment sub-layer and partly outside this additional adjustment sub-layer. The additional getter layer therefore comprises a part on the additional sub-layer and a part outside the additional sub-layer. Depending on the embodiments, the additional adjustment sub-layer is chosen from adjustment sub-layer 10 and one of the getter layers present, the first getter layer 9a or the second getter layer 9b. In this way, the additional getter layer presents two activation temperatures that are different from one another as the additional getter layer presents two areas respectively having different crystalline structures.

Figure 11:
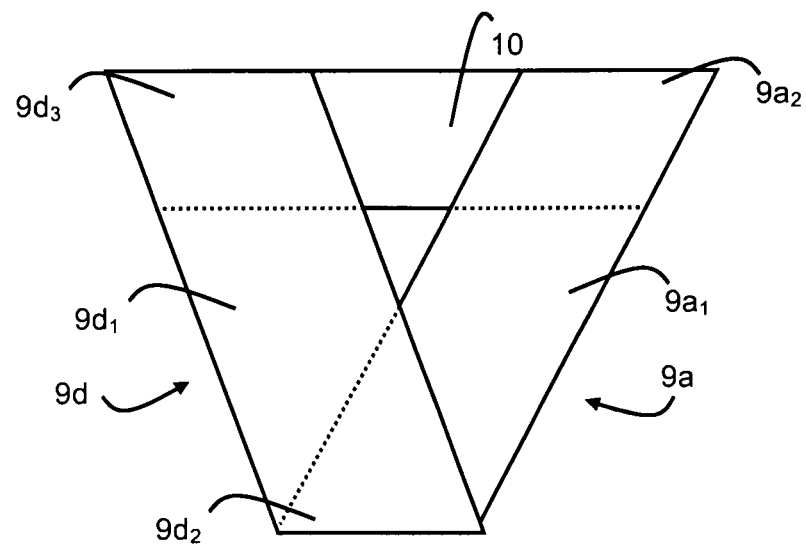

In a fifth alternative embodiment illustrated in FIG. 11 which combines the second and fourth alternative embodiments and which can be combined with the first alternative embodiment, first getter layer 9a covers at least adjustment sub-layer 10 and a part of the substrate or of another support material. Fourth getter layer 9d also covers a part of adjustment sub-layer 10 and a part of the substrate or of another support material. Fourth getter layer 9d also covers a part of first getter layer 9a. First getter layer 9a then comprises first $9a_1$ and second $9a_2$ getter areas. Fourth getter layer 9d for its part comprises first $9d_1$, second $9d_2$ and third $9d_3$ areas having different crystalline structures as they were formed on surfaces which themselves presented different crystalline structures. The apparent crystalline structures of the substrate, adjustment sub-layer 10 and first getter layer 9a being different, the three getter areas of fourth getter layer 9d have different crystalline structures. Fourth getter layer 9d therefore comprises three different activation temperatures, first getter layer 9a comprises two different activation temperatures and the monoblock getter presents five different activation temperatures each linked to a single couple (getter material/crystalline structure).

Figure 12:
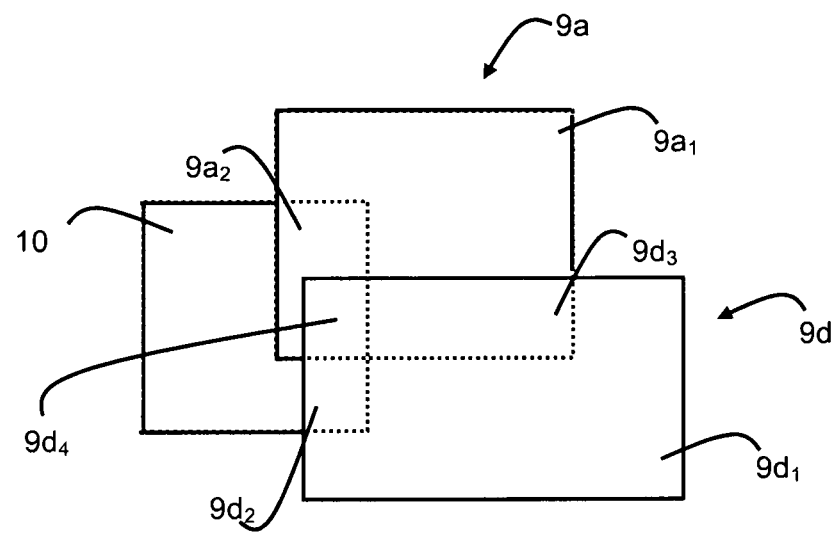

In a sixth alternative embodiment illustrated in FIG. 12 which uses the fifth embodiment, first getter layer 9a covers at least adjustment sub-layer 10 and a part of the substrate or another support layer. Fourth getter layer 9d also covers a part of adjustment sub-layer 10 and a part of the substrate or another support layer. Fourth getter layer 9d in addition covers a part of first getter layer 9a. Fourth getter layer 9d covers a part of first getter layer 9a arranged on adjustment sub-layer 10 and a part of first getter layer 9a arranged outside the adjustment sub-layer. As fourth getter layer 9d covers four different crystalline structures (the substrate, adjustment sub-layer 10 and two different crystalline structures of first getter layer 9a), fourth getter layer 9d comprises different first $9d_1$, second $9d_2$, third $9d_3$ and fourth $9d_4$ getter areas. First getter layer 9a comprises first $9a_1$ and second $9a_2$ getter areas.

Second area $9d_2$ is formed directly on first getter layer 9a, third area $9d_3$ is formed directly on adjustment sub-layer 10 and fourth area $9d_4$ is formed on a part of first getter layer 9a which is formed directly on a part of adjustment sub-layer 10. This particular architecture of monoblock getter 8 enables up to six different activation temperatures to be obtained without loss of space between the different getter areas.

In yet another embodiment that can be combined with the previous embodiments, it is advantageous to form at least a part of the monoblock getter on second adjustment sub-layer 10b. First adjustment sub-layer 10a is then formed on second adjustment sub-layer 10b. The different getter layers can if desired be allowed to overlap this additional activation sub-layer so that the monoblock getter presents at least three additional different activation temperatures. A second adjustment sub-layer 10b is illustrated in FIG. 9 for example purposes.

Monoblock getter 8 can be at least partially formed on an adhesion sub-layer 11. The adhesion sub-layer 11 is designed to enhance the adhesion of adjustment sub-layer 10 and/or of getter layers on substrate 3. For a silicon substrate, adhesion sub-layer 11 is typically produced by any suitable technique, being made for example from titanium, chromium or zirconium and presenting a thickness advantageously comprised between 20 and 100 nm. An adhesion sub-layer 11 is illustrated in FIGS. 3 and 5 for example purposes.

In a particular embodiment which can be combined with the previous embodiments, once the monoblock getter has been formed, a protective layer is deposited. This layer covers all the free surfaces of the getter and does not modify the general functioning of the getter. This protective layer can be made from chromium with a thickness advantageously of less than 50 nm, or by oxidation or nitridation of the free surface of the getter. Oxidation or nitridation is advantageously performed by dry process. Oxidation or nitridation is advantageously performed after deposition of the last getter and before the unprotected getter is exposed to the ambient air.

When an unprotected getter is exposed to the ambient air, it can be activated by heat treatment in a secondary vacuum, and then protected by a layer of oxide or nitride made before the getter is again exposed to the ambient air. The layer of oxide or nitride is advantageously formed by dry process according to a method whereby the thermal budget of the process and the pressure can be controlled.

The layer of chromium is an adjustment sub-layer which can be used as protective layer when it presents a very small grain size, typically grains with a diameter of about 30 nm or smaller. This small grain size allows diffusion at low temperature. As an explicative example, titanium reduces the chromium oxide which is formed during the reaction of the chromium layer with the ambient oxygen. The protective layer diffuses at activation temperature which gives it a temporary effect. The protective layer is only used until activation thereof. The protective layer protects the getter layer from gaseous or liquid chemical aggressions. In an alternative embodiment, the protective layer can be removed, for example by liquid etching with an acid solution or by means of plasma etching. Advantageously the protective layer is eliminated when it is used with a MEMS device which is packaged.

In a particular embodiment, when the protective layer is made from chromium, the protective layer is deposited during formation of the monoblock getter. It is deposited before formation of a getter layer, and is then deposited again after formation of the getter layer. The first deposited protective layer then acts as adjustment sub-layer, but the protective layer presents at least two different crystalline areas depending on the place where it is formed. The general structure of the monoblock getter is not modified nor is its functioning.

All these embodiments enable a getter device presenting a plurality of different activation temperatures to be obtained with a small surface. The techniques used are conventional which makes for easy and economical implementation. The lithographical constraints are small which results in large gains in surface. The monoblock getter is all the more advantageous the larger the number of activation temperatures, as the gain in surface and in ease of production increases Different embodiments are possible to form a monoblock getter.

In a first embodiment illustrated in FIGS. 3, 5, 6 and 9, adjustment sub-layer 10 is formed on substrate 3. A film of adjustment material is deposited by any suitable technique, for example by physical vapor deposition PVD, typically by evaporation, and it is then patterned to form adjustment sub-layer 10. Patterning is performed by any suitable technique, for example by photolithography and etching (dry or wet) or by a technique called lift-off. Adjustment sub-layer 10 is thus formed by a pattern made from adjustment material.

Once adjustment sub-layer 10 has been formed, the first getter material is deposited and then patterned to form first getter layer 9a of the monoblock getter. The first getter material is therefore in contact, in first area $9a_1$, with substrate 3 and, in second area $9a_2$, with adjustment sub-layer 10. First getter layer 9a overlaps the adjustment sub-layer and the overlap delineates the first and second area of the first getter layer. First getter layer 9a at least partially covers adjustment sub-layer 10 to form at least second getter area $9a_2$ of first getter layer 9a and extends outside adjustment sub-layer 10 to form at least first getter area $9a_1$. In the embodiment illustrated in FIGS. 3, 5, 6 and 9, the overlap is represented by a step. The first and second getter areas are then separated by a joining area which also has a getter effect but the activation temperature of which is difficult to establish. In so far as the surface of the joining area is small in comparison with the surfaces of the first and second getter areas, this joining area is ignored. Monoblock getter 8 is then formed by a pattern made from the first getter material which overlaps a pattern made from adjustment material. The pattern of the first getter material comprises the two getter areas having different activation temperatures.

Figure 13:
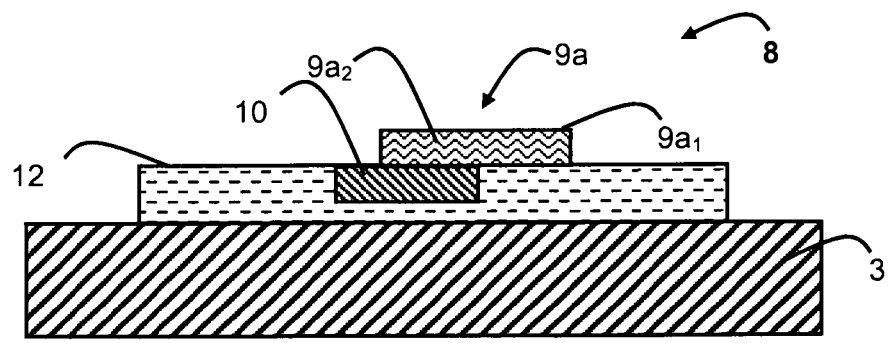

In another embodiment illustrated in FIG. 13, which is more complex to set up, adjustment sub-layer 10 is formed in a patterning material 12. Patterning material 12 is formed and patterned to comprise a void volume which corresponds to the future volume of the adjustment sub-layer. The adjustment material is then deposited and fills at least the void volume. Advantageously, a chemical mechanical polishing step is performed to delineate adjustment sub-layer 10 in patterning material 12 and first getter layer 9$a$ is deposited and patterned. In this embodiment, the first getter layer is flat and comprises first 9$a_1$ and second 9$a_2$ getter areas. Second getter area 9$a_2$ is formed on adjustment sub-layer 10 which is flush with patterning material 12. This embodiment uses the damascene technique which is commonly used in the field of metallic integrated circuit interconnections.

These two embodiments are easily transposable to performing the different alternative embodiments presented in the foregoing in which the adjustment sub-layer is replaced by a getter layer of an already formed sub-getter. These two embodiments can be used in a one and the same monoblock getter.

Figure 16:
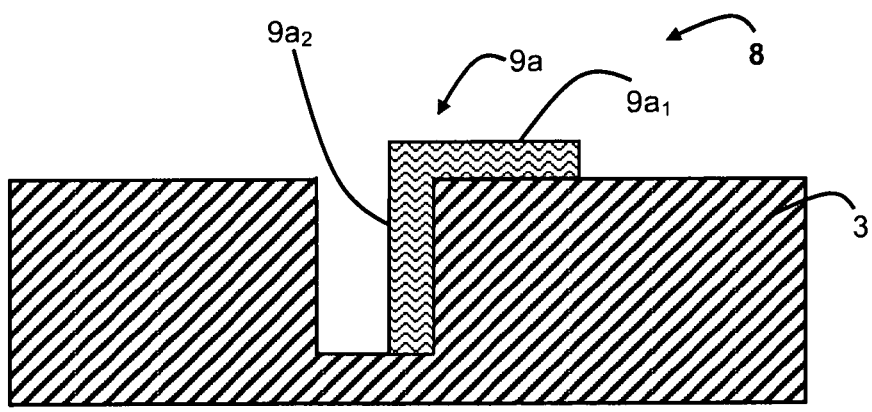

The monoblock getter with at least two activation temperatures is formed by at least a single getter layer, i.e. by a single pattern made from getter material, which reacts to at least two activation temperatures. The monoblock getter can have different shapes, the first and second getter areas can be in the same plane or in parallel planes, one of the areas being above the other. The first and second getter areas can be formed in salient planes, i.e. the main surfaces of the getter areas are not parallel. In so far as certain of the adjustment sub-layer and getter layer deposition methods are directional, it is possible to obtain a monoblock getter comprising different activation temperatures according to the orientation of the directions perpendicular to the different parts of the monoblock getter. For example, it is possible to etch a trench in the substrate and to form an L-shaped getter with different activation temperatures between the vertical plane and the horizontal plane, as shown in FIG. 16. The main surface of the substrate is for example covered in directional manner by the adjustment sub-layer whereas the getter layer is deposited by means of a more uniform method. The getter then comprises a horizontal part which presents an adjustment sub-layer and a first getter layer 9$a$ and a vertical part without an adjustment sub-layer. The horizontal surface of the getter is reduced as a part of the collection surface of the getter is formed in the substrate.

Figure 14:
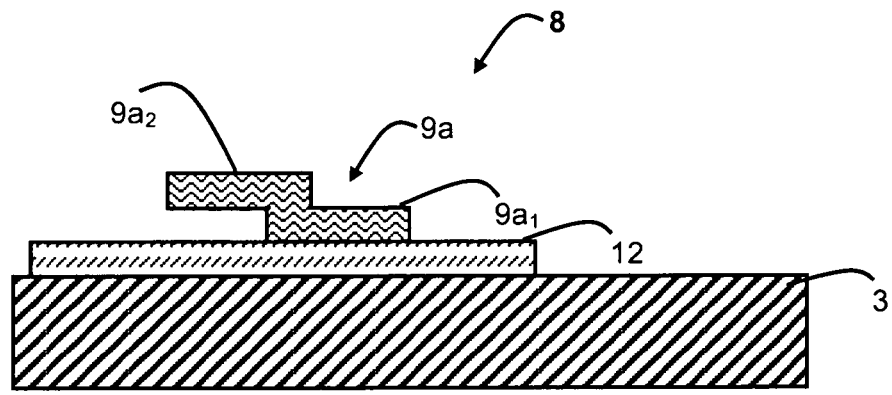
Figure 15:
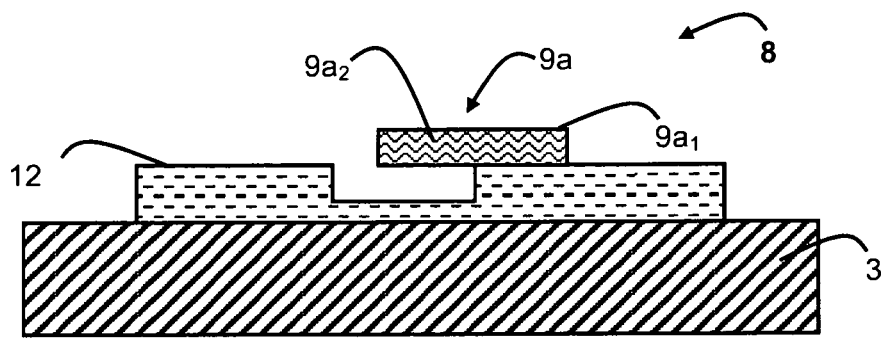

In an alternative embodiment shown in FIGS. 14 and 15, it is advantageous to eliminate adjustment sub-layer 10 once first getter layer 9$a$ has been formed. First getter layer 9$a$ then has two distinct getter areas which present different crystalline structures. Monoblock getter 8 then comprises at least one getter layer which reacts at at least two different activation temperatures, each activation temperature being associated with one of the areas 9$a_1$, 9$a_2$ having a particular crystallographic structure.

Likewise, it is advantageous to have a suspended getter layer, i.e. a layer which presents at least two free opposite surfaces parallel to the main surface of the support substrate to increase the pumping rate without increasing the surface occupied on the substrate. Thus, by using suspended getters, an increase of the pumping rate is achieved without increasing the surface occupied by the monoblock getter, and without increasing the quantity of gas able to be absorbed or adsorbed (at constant getter volume). Such a suspended getter can be obtained easily by eliminating a sacrificial material, for example the adjustment sub-layer 10 or patterning material 12, once the getter 8 has been formed.

In the present application, reference is made to areas presenting different crystalline structures. This difference of structure can result in a getter area which is monocrystalline and the other which is polycrystalline, or by two polycrystalline areas having different crystalline structures. In advantageous manner, the difference of structure results in two polycrystalline areas which present different grain sizes, the two crystalline structures being of polycrystalline type with columnar grains.

In the monoblock getter, each of the constituent layers is in direct contact with at least one of the other constituent layers. A mechanical link exists between the different layers forming the monoblock getter, this link being materialized either by a direct contact between the different layers constituting the monoblock getter or by an indirect contact coming from an intermediate layer, for example adjustment sub-layer 10. In this way, the monoblock getter forms a whole and the getter can only be moved as a whole, i.e. all of the getter layers forming monoblock getter 8.

In a general manner, the free surface of the getter area defines the pumping rate of the getter area whereas its volume defines the total quantity of gas which can be absorbed by the getter area. According to requirements, a trade-off therefore has to be found between the free surface of the getter areas, the volume of the monoblock getter and the global surface of the getter which corresponds to a lost surface in the future structure which incorporates it.

In the different embodiments described, the monoblock getter presents a large number of different activation temperatures. However, it is possible to reduce the number of activation temperatures by not depositing all the getter layers on at least two materials presenting different crystalline structures. In this way, it is possible for a given surface to precisely define the few usable activation temperatures, their associated pumping rate and the volume which can be eliminated.

For example purposes, to reduce the number of activation temperatures, fourth getter layer 9$d$ is only deposited on first getter layer 9$a$ in the embodiment illustrated in FIG. 12, or fourth getter layer 9$d$ is only deposited on adjustment sub-layer 10 and on first getter layer 9$a$ in the embodiment of FIG. 11.

According to the different embodiments described, the monoblock getter presents stacks comprising at least one activation temperature adjustment sub-layer and a getter layer. Examples of embodiments incorporate two or three getter effect materials but it is possible to form monoblock getters incorporating more different getter layers. In each of the embodiments, by choosing the materials cleverly and at least partial overlapping them, it is possible to form a monoblock getter which presents more getter areas than there are getter materials present. Typically, the monoblock getter can present twice as many getter areas having their own activation temperature than the number of getter layers present.

In a general manner, when the monoblock getter comprises n distinct getter layers, with n greater than or equal to 1, and l getter material activation temperature adjustment sub-layers (with l greater than or equal to 1), and when each getter layer is arranged on at least two different materials (the getter layer comprises a part on one of the adjustment sub-layers and another part outside this sub-layer), a monoblock getter can be obtained comprising more different getter areas than getter layers (m getter areas with m>n), typically twice as many getter areas as getter material layers. Each getter area has its own activation temperature.

It is therefore possible to form one or more monoblock getters on a sacrificial substrate and to place at least one of these monoblock getters inside a future closed cavity. It is also possible to advantageously form the getter in the future cavity. If the cavity has to present a pressure comprised within a certain range, it is advantageous to perform pressure control by means of a plurality of activation temperatures. In this way, depending on the temperature imposed on the getter, a certain volume of getter material is activated and intervenes to make the pressure drop within the desired range.

The invention claimed is:

1. A structure including:
a support comprising a first face,
a monoblock getter comprising a first getter layer made from a first getter material, the first getter material presenting an uncovered pumping surface comprising first and second getter areas having different crystalline structures so as to present first and second getter areas with different activation temperatures,
wherein the first getter area comprises two opposite faces devoid of a covering layer and the second getter area is formed on the first face of the support.

2. A structure including:
a support comprising a first face,
a trench formed in the first face,
a monoblock getter comprising a first getter layer made from a first getter material, the first getter material presenting an uncovered pumping surface comprising first and second getter areas having different crystalline structures so as to present first and second getter areas with different activation temperatures,
wherein the first getter area is deposited on a sidewall of a trench formed in a substrate and the second getter area is formed on the first face of the support.

3. A structure including:
a support comprising a first face,
a monoblock getter comprising a first getter layer made from a first getter material, the first getter material presenting an uncovered pumping surface comprising first and second getter areas having different crystalline structures so as to present first and second getter areas with different activation temperatures,
wherein the monoblock getter is devoid of electric contact.

4. A monoblock getter comprising:
an activation temperature adjustment sub-layer,
a first getter layer made from a first getter material, the first getter material presenting an uncovered pumping surface comprising first and second getter areas having different crystalline structures so as to present first and second getter areas with different activation temperatures,
wherein a first end of the activation temperature adjustment sub-layer is covered by the second getter area, and a second end opposite to the first end of the activation temperature adjustment sub-layer is not covered.

5. A monoblock getter comprising a first getter layer made from a first getter material, the first getter material presenting an uncovered pumping surface comprising first and second getter areas having different crystalline structures so as to present first and second getter areas with different activation temperatures.

6. The monoblock getter according to claim 5, wherein the monoblock getter is at least partially covered by a protective layer.

7. A structure comprising a closed cavity under a controlled atmosphere in which at least one monoblock getter according to claim 5 is arranged.

8. The monoblock getter according to claim 5, wherein the activation temperature adjustment sub-layer is made of a metallic layer.

9. The monoblock getter according to claim 5, wherein the second getter area is configured to react with the atmosphere present inside the cavity so as to pump the atmosphere.

10. The monoblock getter according to claim 5, wherein the second getter area is arranged on an activation temperature adjustment sub-layer.

11. The monoblock getter according to claim 10, wherein the first getter area and the activation temperature adjustment sub-layer are formed on the same substrate.

12. The monoblock getter according to claim 10, wherein the activation temperature adjustment sub-layer is a second getter layer, the monoblock getter comprising a third getter area arranged in the second getter layer.

13. The monoblock getter according to claim 10, wherein the first and second getter areas are formed in parallel planes.

14. The monoblock getter according to claim 10, wherein the first getter layer overlaps the activation temperature adjustment sub-layer to form a step between the first and second getter areas.

15. The monoblock getter according to claim 10, comprising an additional getter layer with a portion on an additional sub-layer and a portion outside the additional sub-layer, the additional sub-layer is chosen from the activation temperature adjustment sub-layer and a getter layer, thereby the additional getter layer presents first and second additional getter areas respectively having different crystalline structures from one another.

16. The monoblock getter according to claim 10, wherein the activation temperature adjustment sub-layer is made of a second getter material and is completely covered by the first getter material.

17. The monoblock getter according to claim 10, comprising an additional getter layer with a portion on an additional sub-layer and a portion outside the additional sub-layer, the first getter layer and the additional getter layer are made from a same getter effect material, the first getter layer and the additional getter layer presenting getter areas each having a different crystalline structure from the other getter areas thereby having different activation temperature.

18. The monoblock getter according to claim 17, wherein the additional getter layer is arranged partly on two areas of the first getter layer which present different crystalline structures and arranged partly outside the first getter layer.

19. The monoblock getter according to claim 10, comprising at least one additional activation temperature adjustment sub-layer.

20. The monoblock getter according to claim 19, comprising a plurality of getter layers, each getter layer comprising a part on one of the adjustment sub-layers and a part outside said adjustment sub-layer so that the getter comprises more getter areas than getter layers.

* * * * *